United States Patent
Takagi

(10) Patent No.: US 6,487,123 B1
(45) Date of Patent: Nov. 26, 2002

(54) SEMICONDUCTOR INTEGRATED CIRCUIT, INK CARTRIDGE HAVING THE SEMICONDUCTOR INTEGRATED CIRCUIT, AND INKJET RECORDING DEVICE HAVING THE INK CARTRIDGE ATTACHED

(76) Inventor: Tetsuo Takagi, c/o Seiko Epson Corporation, 3-5, Owa 3-chome, Suwa-shi, Nagano-ken, 392-8502 (JP)

( * ) Notice: Subject to any disclaimer, the term of this patent is extended or adjusted under 35 U.S.C. 154(b) by 0 days.

(21) Appl. No.: 09/857,451
(22) PCT Filed: Oct. 4, 2000
(86) PCT No.: PCT/JP00/06935
§ 371 (c)(1), (2), (4) Date: Aug. 1, 2001
(87) PCT Pub. No.: WO01/26115
PCT Pub. Date: Apr. 12, 2001

(30) Foreign Application Priority Data

Oct. 4, 1999 (JP) .......................................... 11-283245

(51) Int. Cl.$^7$ ............................................. G11C 16/06
(52) U.S. Cl. ................................. 365/185.25; 365/203
(58) Field of Search ................................ 365/203, 204, 365/185.23, 185.25

(56) References Cited

U.S. PATENT DOCUMENTS

| 5,175,705 A | * | 12/1992 | Iwahashi | ................ | 365/185.25 |
| 5,229,963 A | * | 7/1993 | Ohtsuka | ................. | 365/185.23 |
| 5,400,285 A | * | 3/1995 | Sakata | ......................... | 365/205 |
| 5,703,820 A | * | 12/1997 | Kohno | ........................ | 365/204 |
| 6,188,612 B1 | * | 2/2001 | Okino | .................... | 365/185.25 |
| 6,243,297 B1 | * | 6/2001 | Nagatomo | ............. | 365/185.25 |

FOREIGN PATENT DOCUMENTS

| JP | 05-301349 | 11/1993 |
| JP | 10-069793 | 3/1998 |

* cited by examiner

*Primary Examiner*—Son Mai
(74) *Attorney, Agent, or Firm*—Rosalio Haro

(57) ABSTRACT

A delay unit is used to prevent writing errors due to residual charge on a bit line when changing rows to write to another bit line. By having a delay unit, a discharge time for discharging charge stored in a parasitic capacitance is reserved. An address is changed after the elapse of the reserved discharge time to assure that discharge is completed and writing errors do not occur. Charge can quickly build up in signal lines of a semiconductor integrated circuit having a charge unit for charging lines in a memory array of n rows and m columns. Write errors can therefore occur when charging a signal line corresponding to a next row after writing to all bits of one column is completed, and then sequentially writing to each bit in the column corresponding to the signal line charged by the charge unit.

19 Claims, 13 Drawing Sheets

US 6,487,123 B1

SEMICONDUCTOR INTEGRATED CIRCUIT, INK CARTRIDGE HAVING THE SEMICONDUCTOR INTEGRATED CIRCUIT, AND INKJET RECORDING DEVICE HAVING THE INK CARTRIDGE ATTACHED

BACKGROUND OF THE INVENTION

1. Technical Field

The present invention relates to a semiconductor integrated circuit, an ink cartridge having the semiconductor integrated circuit, and an inkjet recording device having the ink-cartridge attached, more particularly to a semiconductor integrated circuit having a non-volatile memory built in and using boosted voltage for data writing, an ink cartridge having the semiconductor integrated circuit, and an inkjet recording device having the ink cartridge attached.

2. Background Art

Conventionally, such a semiconductor integrated circuit performs a write operation by voltage boosted by an internal booster circuit when writing data on a built-in, non-volatile memory. At the end of writing, charge stored in a signal line charged at the time of writing is discharged before shifting to the next writing operation. In this case, the discharging is performed by a discharge circuit within a semiconductor integrated circuit.

FIG. 13 is a circuit diagram showing a discharge circuit in a conventional semiconductor integrated circuit. As shown in FIG. 14, the discharge circuit discharges charge stored in a parasitic capacitance Cx associated with each signal line of a memory cell array 5. The parasitic capacitance Cx is charged in the following manner. An address counter 2 performs a count operation in response to an input of a write signal WR so that the address decoder 103 operates with the count value from counter 2 as input. The address decoder 103 includes a column decoder 4 and a row decoder 3 for respectively specifying a column and a row of memory cells from among the plurality of rows and columns of memory cells forming the memory cell array 5. The memory cell array 5 includes a plurality of memory cells arranged in n rows by m columns.

Each output of the column decoder 4, that is the decoded result, is input to the base terminal of a corresponding transistor Tr1, Tr2, . . . and Trm, which are switching elements. Then, a source terminal of each transistor is connected to a data line DW while drain terminal is connected to a signal line corresponding to each column of memory cells in the memory cell array 5. Therefore, by turning any one of transistors Tr1, Tr2, . . . and Trm to the ON state with the output of the column decoder 4, a signal line corresponding to each column is charged by voltage of the data line DW through the transistor. In other words, charge is stored in a parasitic capacitance of the signal line corresponding to the column specified by the column decoder 4. For example, when the transistor Tr1 is turned ON, charge is stored in a parasitic capacitance shown added to a signal line at a node A.

Here, an output of the input/output control circuit 8 is supplied to the data line DW. The input/output control circuit 8 includes an internal booster circuit 107 for boosting voltage of a power supply $V_{DD}$ in response to an input of the write signal WR, an inverter for generating an inverted signal of the write signal WR, a switching transistor 106 to whose gate terminal is supplied the output of the inverter 105, which is the inverted signal of the write signal WR, and a buffer 108 supplying to data line DW a voltage corresponding to thy data value of input I/O. Buffer 108 receives as a power supply the output $V_{pp}$ of booster circuit 107.

In the circuit 101 having such a construction, the write signal WR is at high level when writing to a memory cell while the transistor 106 is in the OFF condition. Here, the power supply $V_{DD}$ is supplied to the internal booster circuit 107, resulting in a higher potential (15 volt, for example) for the boosted output $V_{PP}$. The potential is supplied to the buffer 108 as a power supply. Thus, voltage corresponding to a value of the data input I/O is supplied from the buffer 108 to the data line DW. In this condition, turning any one of the transistors Tr1, Tr2, . . . to the ON condition results in a signal line of the corresponding column being charged by the voltage of the data line DW through the transistor. In the condition where the signal line is charged (the condition where charge is stored), data is written in each one of memory cells within the memory cell array 5 by the sequential changes in the outputs of the row decoder 3.

ON the other hand, at the time of reading from a memory cells, and at other times, the write signal WR is at the low level and the transistor 106 is turned ON. At this time, the power supply $V_{DD}$ is not supplied to the internal booster circuit 107, which turns the boosted output VPP to a lower non-boosted potential (5 volt, for example). The buffer 108, which receives the lower, non-boosted potential $V_{pp}$ as its power supply, responds by bringing its output to the low level regardless of the value of the data input I/O. Therefore, the above-described stored charge are discharged through the data line DW to which the output of the buffer 108 is supplied. For example, the charge stored in the parasitic capacitance Cx shown added to node A is discharged toward ground through buffer 108.

In short, in the conventional discharge circuit, by turning transistor 106 to the ON state at the end of a writing operation, the accumulated charge is discharged. However, in the semiconductor integrated circuit 101 having such a discharge circuit, there are problems as follows:

First of all, it takes time for removing charge completely. Thus, there is a problem that a certain amount of time is required before writing to the next memory cell.

Further, when the count value of the address counter changes at the same time as the end of a writing operation, residual charge in the parasitic capacitance resulting in higher voltage than expected, may lead to the error of wrong writing due to the parasitic capacitance not being completely discharged. The wrong writing will be described with reference to FIG. 14.

In the figure, when writing on a X1 column of memory cells, the transistor Tr1 is turned ON by the column decoder 4, first of all, and the parasitic capacitance Cx shown at node A is charged. In the charged condition, writing is performed by the row decoder 3 in order from row Y1, to row Y2 . . . to row Yn. When each writing operation is completed, the parasitic capacitance Cx is discharged as described above. After the discharging following the writing operation to row Yn, the transistor Tr2 corresponding to a next column of X2 is turned ON by the column decoder 4, and a next parasitic capacitance Cx is charged. In the charged condition, writing is performed by the row decoder 3 in order from row Y1, to row Y2 . . . to row Yn. Charging and discharging is repeatedly on the remaining signal lines in similar manner. Through this operation, each 1 bit is addressed in order from column X1 and row Y1 to column Xm and row Yn, by which writing is performed on all memory cells of memory cell array 5.

In the operation above, when transitioning from a writing operation on column X1 and row Yn to a writing operation on column X2 and row Y1, it may happen that row Y1 is selected before the discharging of the signal line of column X1 is fully complete. In this case, there is a problem the residual charge may cause wrong writing (i.e. writing to the wrong memory cell).

The present invention was made in order to overcome the problems of the above-describe conventional technology. A purpose of the present invention is to provide a semiconductor integrated circuit having a discharge circuit, that can surely discharge, an ink cartridge using it, and an inkjet recording device having the cartridge.

DISCLOSURE OF INVENTION

In a first aspect of the present invention, a memory addressing circuit sequentially cycles through all memory cells within a memory array when a memory circuit is placed in write mode of operation. Furthermore, a transition suppressing circuit, or delay circuit, inhibits the transitioning from a first addressed memory cell to the next addressed memory cell for a predetermined time period following the completion of a write operation to the first addressed memory cell. In the presently preferred embodiment, the program voltage generating circuit, which selectively supplies a high programming voltage to a memory cell during a write operation, is also used to discharge a column line following the end of the write operation. The time period used by the transition suppressing circuit is selected such that the program voltage generating circuit has enough time to fully discharge the column line prior to the next memory cell being selected. This is especially important when transitioning from a first column of memory cells to the next column of memory cells since the column line corresponding to the first column of memory cells remains floating once the next column line is selected. Therefore, any residual charge remaining on the first column line may cause erroneous writing to an unintended memory cell within the first column when a row line is activated for addressing a memory cell in the next column.

A semiconductor integrated circuit according to the present invention includes a charge means for charging a signal line corresponding to each 1 row in response to an input of a writing instruction for each bit of a memory cell arranged in n rows by m columns (where n and m are natural numbers and so forth) and charging a signal line corresponding to a next row after writing on all bits for one row is completed. The semiconductor integrated circuit performs writing on each 1 bit sequentially in each of bits for 1 row corresponding to the signal line charged by the charge means. Further, the semiconductor integrated circuit includes a delay means for delaying an input of the writing instruction to the charge means for at least a time equivalent to a discharge time for the signal line.

Another semiconductor integrated circuit according to the present invention includes a charge means for charging a signal line corresponding to each 1 row in response to an input of a writing instruction for each bit of a memory cell arranged in n rows by m columns and charging a signal line corresponding to a next row after writing on all bits for one row is completed. The semiconductor integrated circuit performs writing on each 1 bit sequentially in each of bits for 1 row corresponding to the signal line charged by the charge means. Further, the semiconductor integrated circuit includes a suppressing means for suppressing a change in address indicating a cell to be written within a predetermined time after completing the writing for 1 bit. In this case, the suppressing means may be a delay circuit for delaying an input of the writing instruction to the charge means for at least a time equivalent to a discharge time for the signal line.

Another semiconductor integrated circuit includes a charge means for charging a signal line corresponding to each 1 row in response to an input of a writing instruction for each bit of a memory cell arranged in n rows by m columns and charging a signal line corresponding to a next row after writing on all bits for one row is completed. The semiconductor integrated circuit performing writing on each 1 bit sequentially in each of bits for 1 row corresponding to the signal line charged by the charge means. Further, the semiconductor integrated circuit includes a delay means for differentiating timing for completing writing for 1 bit and timing for changing an address indicating a cell to be written for a time equivalent to a time for charging at least the signal line.

The above-described charge means comprises a counter for starting an count operation in response to an input of the writing instruction, a column decoder for decoding a count value of the counter, a switching element for charging the signal line by connecting a predetermined power supply to the signal line after turned ON depending on a decode result by the decoder, and a row decoder for specifying each 1 bit sequentially for 1 row of bits corresponding a signal line charged when the switching element is turned ON.

An ink cartridge according to the present invention has the above-described semiconductor integrated circuit, for storing at least a remained amount of ink on the memory cell.

An inkjet recording device according to the present invention has the above-described ink cartridge for printing desired image information by using ink supplied from the ink cartridge.

BEST MODE FOR CARRYING OUT THE INVENTION

Figure 1:
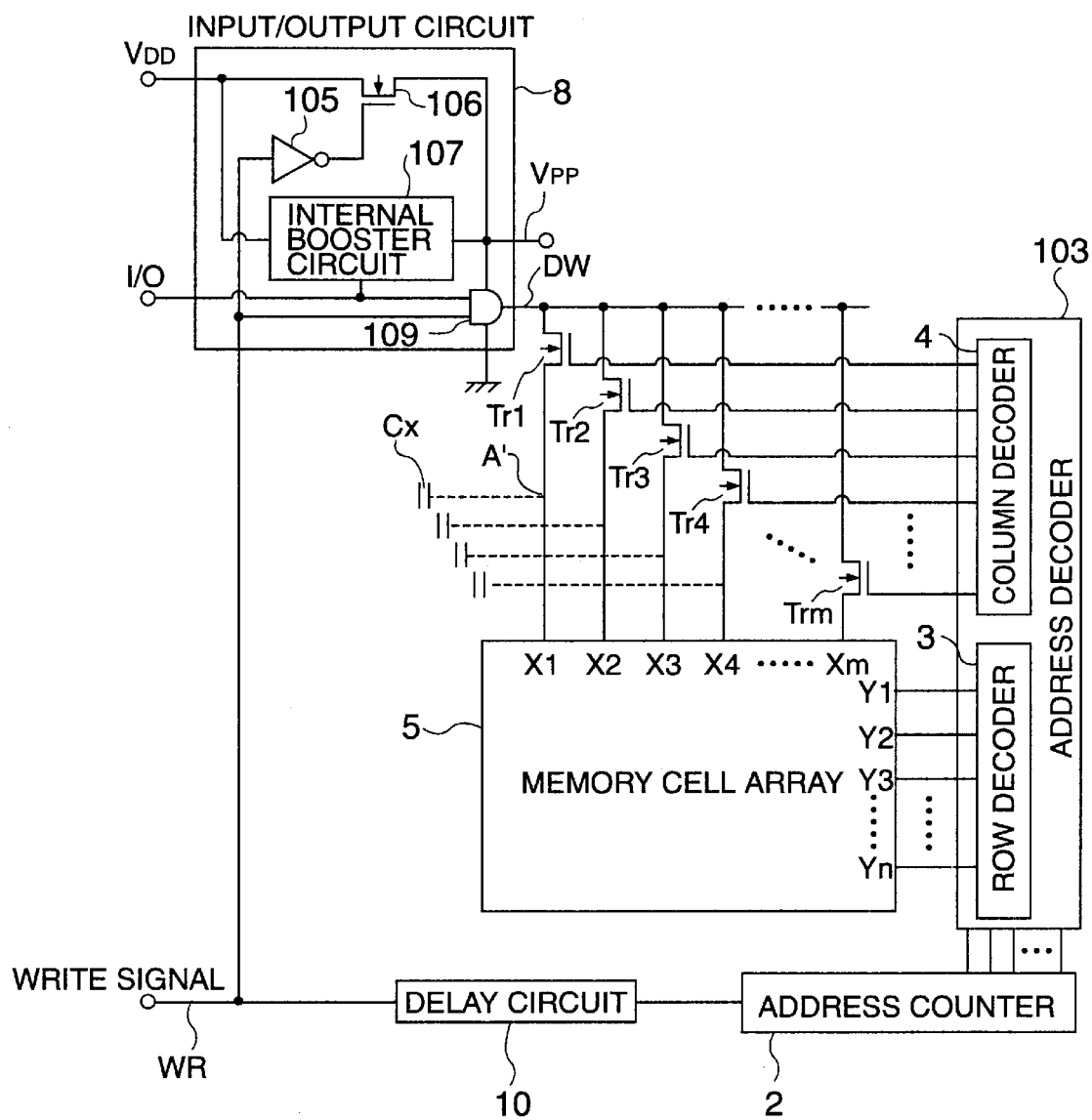
FIG. 1 is a circuit diagram showing one example of a discharge circuit within a semiconductor integrated circuit according to the present invention.

Next, an embodiment of the present invention will be described with reference to drawings. In each of the drawings referenced in descriptions below, parts similar to those in other drawings are similar by identical reference numerals.

Figure 13:
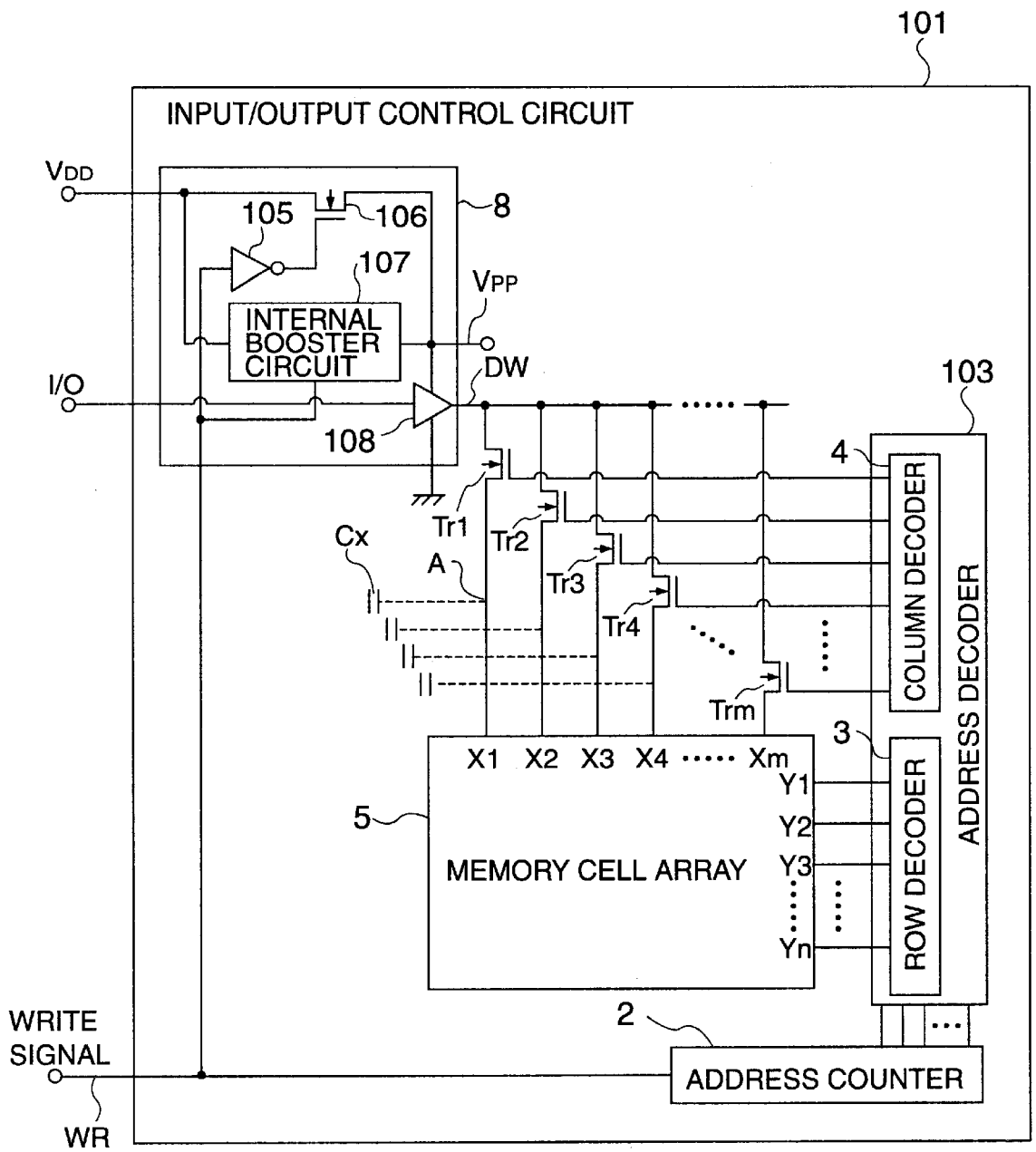
FIG. 13 is a block diagram showing one example of a conventional discharge circuit.
Figure 14:
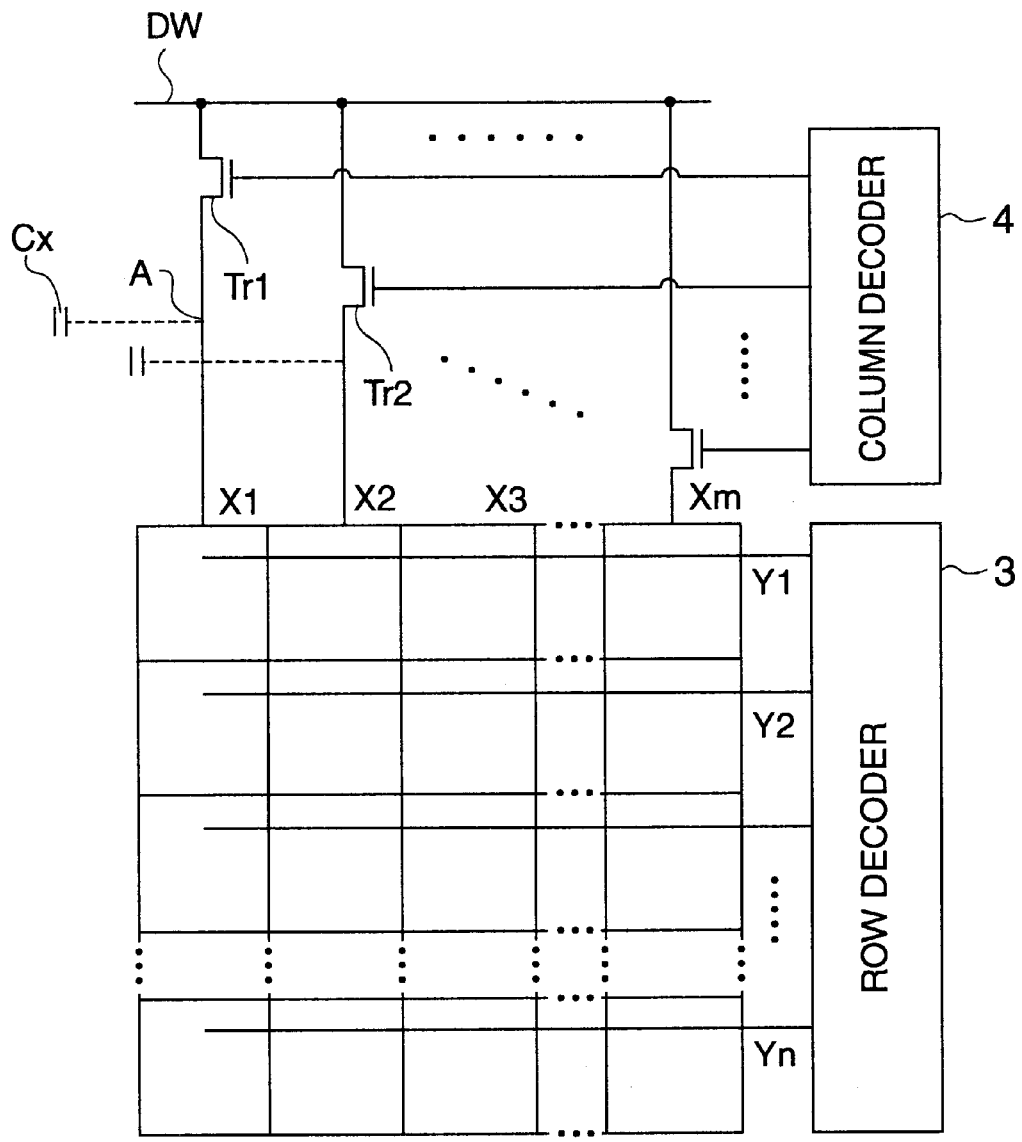
FIG. 14 is a diagram for describing an operational example of the discharge circuit shown in FIG. 13.

FIG. 1 is a circuit diagram showing a construction example of a discharge circuit within a semiconductor integrated circuit according to the present invention. The discharge circuit shown in the figure is different from a conventional circuit shown in FIG. 13, and a delay circuit 10 is inserted before an address counter 2. Further, an AND gate 109 is provided in place of a buffer 108.

In the circuit in this construction, an input of a write signal WR to the address counter 2 can be delayed by the delay circuit 10. That is, by delaying the update function of the address counter 2 for selecting the next address after a writing operation, sufficient time can thus be arranged to fully discharge a column line through a corresponding column-selecting transistor, Tr1–Trm, and AND gate 109. More specifically, the discharge is performed through the column-selecting transistor via the internal output stage of AND gate 109.

In general, in such semiconductor integrated circuits, address updating may take place anytime within a response margin following the trailing edge, i.e. transition event, of the right signal WR. However, in circuits having automatically incremented address counters, like. in the present circuit, residual charge, as described above, can remain on a column line between address update events if the discharge time, i.e. the time between a write signal transition event and an address update event, is not made long enough. Therefore, in the present circuit, the transition event of the write signal WR and the address updating events are offset from each other. More specifically, the discharge time is assured predetermined time margin, set by delay circuit 10, by delaying an address update event following a transition event of the write signal WR.

In this case, the discharge speed depends on a driving capability (equivalent resistance) of the discharge circuits, such as AND gate 109 and column-select transistors Tr1–Trm, and the delay time can be calculated as the product of an equivalent resistance R and a capacitance Cx, that is, a time constant. Further, in order to reduce the size of the circuit as much as possible, it is convenient to keep the insertion of the delay circuit 10 at one point. Thus, in this embodiment, it is provided at a position before the address counter 2 (input side).

Figure 2:
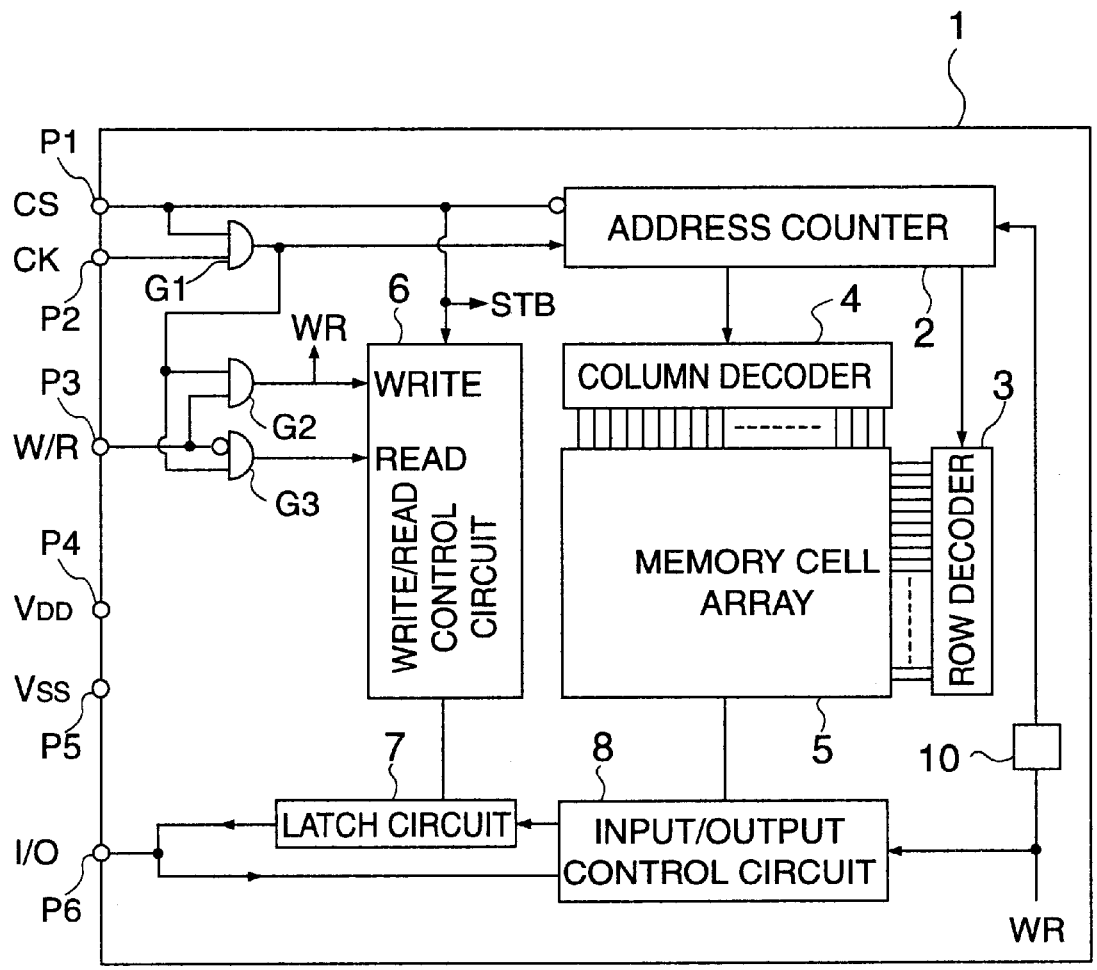
FIG. 2 is a functional block diagram for describing an internal construction of a semiconductor integrated circuit using the discharge circuit in FIG. 1.

FIG. 2 is a functional block diagram for describing an internal construction of a semiconductor integrated circuit using the discharge circuit shown in FIG. 1. As shown in the figure, a semiconductor integrated circuit 1 includes an address counter 2 for performing a count operation, a row decoder 3 and a column decoder 4 for decoding a count value in the address counter 2 in order to create an address, a memory cell array 5 for storing data, a write/read control circuit 6 for controlling a latch circuit 7 and a buffer B, not shown, whose operation depends on whether one is writing-in to or reading-out from the memory cell array 5. The latch circuit 7 controlled by the write/read control☐circuit 6 is selectively set to a latch state or a pass through state. The semiconductor integrated circuit 1 also includes an input/output control circuit 8 for controlling inputs and outputs of data to the memory cell array 5, AND gates G1 to G3, and a delay circuit 10 for delaying write signals. Further, the semiconductor integrated circuit 1 is provided with external terminals P1 to P6.

The count value of the address counter 2 is initialized to a predetermined value based on an inverted signal of a chip-select input signal CS input from the external terminal P1. Further, the address counter 2 creates updated address data based on a signal input from the AND gate G1. The created address data is input to the row decoder 3 and the column decoder 4.

The column decoder 4 selects desired vertical column of memory cells in the memory cell array 5 based on address data input from the address counter 2. Similarly, the row decoder 3 selects desired horizontal row of memory cells in the memory cell array 5 based on address data input from the address counter 2.

The memory cell array 5 is formed by arranging a plurality of memory cells in grids. Each memory cell is turned to an ON state by a select signal from the row decoder 3, while a select signal from the column decoder 4 enables information stored in the memory cell to be read and written. In this case, it is assumed that the memory cell array 5 is formed by non-volatile memory cells.

The write/read control circuit 6 determines whether write-in operation or read-out operation is performed on the memory cell array 5 based ox chip-select control signals CS input from the external terminal P1 and signals output from an AND gate G2 and G3. The output of the AND gate G2 is write signal WR. The latch circuit 7 outputs read data of the memory cell array 5 to an external terminal P6 after keeping it for a predetermined period of time, which is output from the input/output control circuit 8, based on a control signal from the write/read control circuit 6. The latch circuit 7 performs either a latch operation or a pass through operation depending on an output of the write/read control circuit 6. The latch circuit 7 performs the latch operation when the output of the write/read control circuit 6 is at the low level, and the latch circuit 7 operates the pass through operation when the output of the write/read control circuit 6 is at the high level. The latch operation is an operation for maintaining the output state. The through operation is an operation for sending out the input signal as an output signal as it is.

The input/output control circuit 8 writes, in the memory cell array 5, data input from the external terminal P6, or conversely, outputs data read out from the memory cell array to external terminal P6 through the latch circuit 7. The input/output control circuit 8 is operated by write signals WR. The write signal WR is input to the address counter 2 after being delayed by the delay circuit 10. The delay time of the delay circuit 10 is a time substantially equal to a time for discharging charge accumulated in the above-described parasitic capacitance Cx. According to the construction above, data writing is performed on the memory cell array 5. The written data is, for example, a remaining amount of ink. By writing the amount of remaining ink, the remaining amount of ink can be always monitored.

The AND gate G1 outputs, to the address counter 2 and the And gate G2 and G3, a signal which is a logic AND combination of a chip-select control signal CS input from the external terminal P1 and a clock input signal CK input from the external terminal P2.

The AND gate G2 outputs, to the write/read control circuit 6, a signal which is a logic AND combination of an output signal from the AND gate G1 and a write/read input signal W/R from the external terminal P3. On the other hand, the AND gate G3 outputs, to the write/read control circuit 6, a signal which is a logic AND combination of an output signal from the AND gate G1 and an invert signal of the write/read input signal W/R from the external terminal P3.

More specifically, when the input signal from the AND gate G1 is "L", the outputs of the AND gates G2 and G3 are both "L". On the other hand, when the input signal from the AND gate G1 is "H", and a write/read input signal W/R is "H", the output of the AND gate G2 is "H" while the output of the AND gate G3 is "L". Conversely, if the write/read input signal W/R is "L", the output of the AND gate G2 is "L" while the AND gate G3 is "H". In this way, the AND gates G2 and G3 are arranged not to have undefined outputs even if the write/read input signal W/R varies.

The external terminal P1 is a terminal for inputting a chip-select input signal CS, that is a control signal STB for selecting a specific device when a plurality of devices exist at the same time, for initializing the address counter 2, and for shifting the operation mode. That is, the external terminal P1 in this embodiment is a terminal used both as a control terminal for initializing an address counter and as a control terminal for an operation mode.

The external terminal P2 is a terminal for inputting a clock input signal CK that is a reference for the semiconductor integrated circuit 1 to operate. The external terminal P3 is a terminal for inputting a write/read input signal W/R for specifying an access operation on the memory cell array 5 built in the semiconductor integrated circuit 1.

The external terminals P4 and P5 are input terminals for applying operational voltage at a high potential voltage level $V_{DD}$ and at a low potential voltage level $V_{SS}$ for the semiconductor integrated circuit 1 to operate. The external terminal P6 is an input/output terminal for inputting data to be actually written in the memory cell array 5 built in the semiconductor integrated circuit 1 and/or for outputting data read out from the memory cell array 5.

Next, operations of the semiconductor integrated circuit according to this embodiment will be described with reference to FIGS. 3 and 4.

Figure 3:
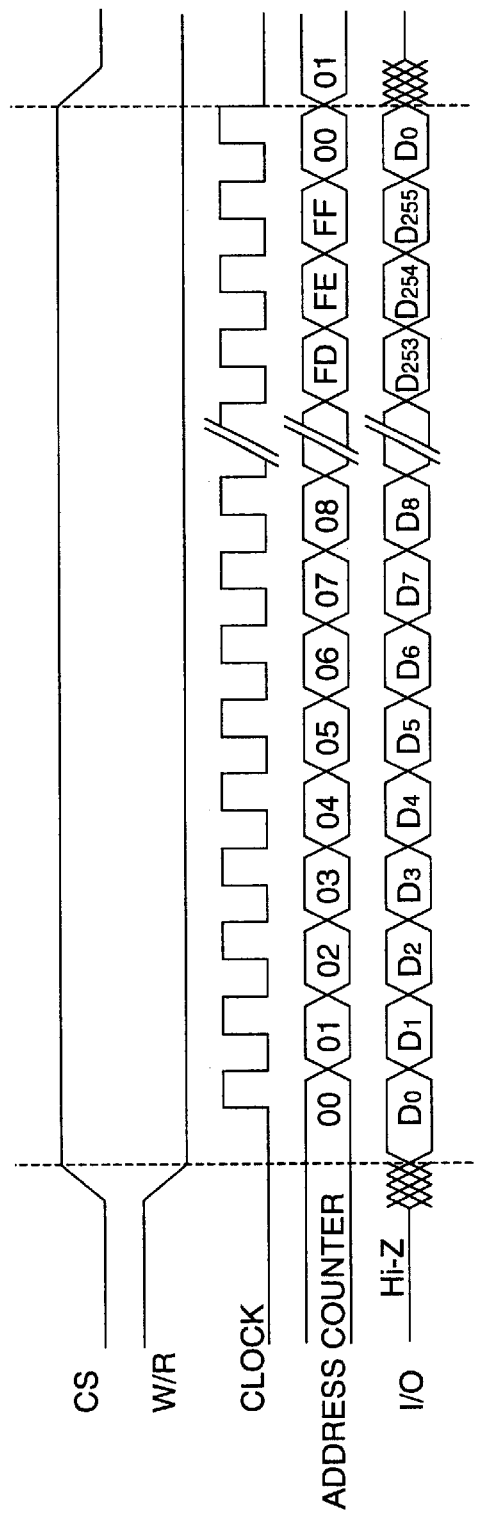
FIG. 3 is a timing chart for describing a read-out operation onto the semiconductor integration circuit.

FIG. 3 is a timing chart for describing a readout operation on a semiconductor integrated circuit. FIG. 3 shows the chip-select control signal CS, the write/read input signals W/R, the clock CLOCK, the count values of the address counter 2, and the input/output signals I/O in the external terminal P6 in FIG. 2. When the readout is performed on the memory cell array 5, the "L" is applied to the external terminal P1, first of all, to initialize the address counter 2. Next, "H" is applied to the external terminal P1, and clock pulses for an predetermined readout start address is input from the external terminal P2. During inputting the clock pulses, "L" is applied for specifying the readout is applied as a write/read input signal W/R from the external terminal P3.

The address corresponding to data is output in a period when the clock-input signal CK is turned to "L". During the period when the clock input signal CK is "H", the value is maintained since it is latched within the latch circuit 7 in the leading edge. In the trailing edge, the address is incremented, and data for the next address is output from the external terminal P6.

Figure 4:
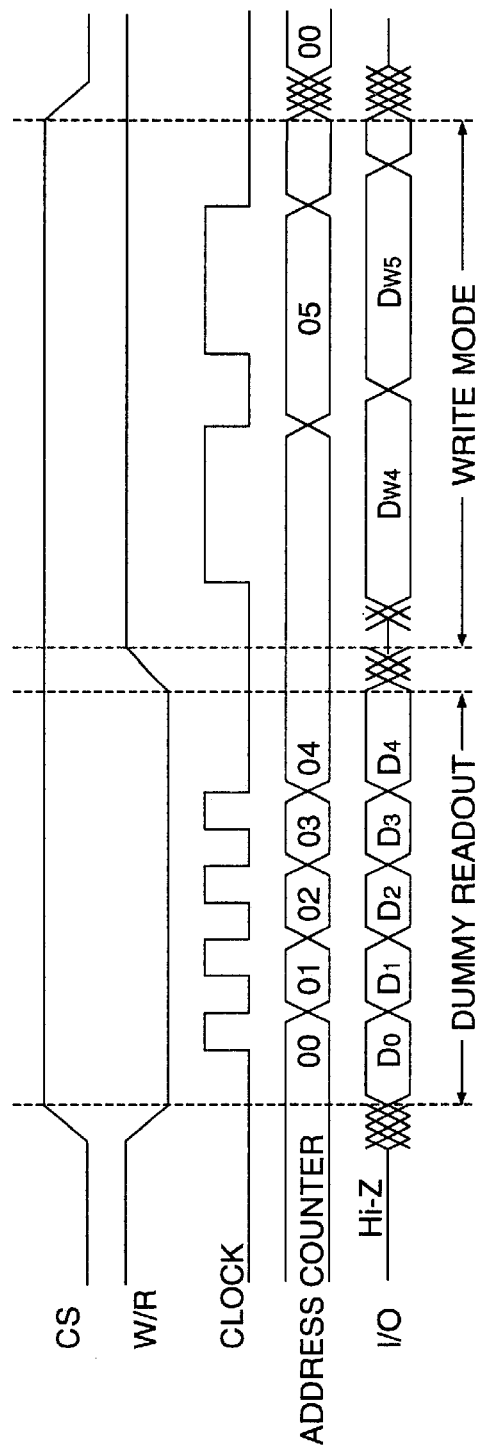
FIG. 4 is a timing chart for describing a write-in operation from the semiconductor integrated circuit.

FIG. 4 is a timing chart for describing a write operation from the semiconductor integrated circuit, for example. FIG. 4 shows the chip-select control signals CS, the write/read input signals W/R, the clock CLOCK, the count values of the address counter 2, and the input/output signals I/O in the external terminal P6. When a write is performed on the memory cell array 5, "L" is applied to the external terminal P1 in a condition where the write/read input signal W/R is "L" in order to initialize the address counter 2. Next, "H" is applied to the external terminal P1, and clock pulses for an intended write start address are input from the external terminal P2. Then, while the write operation is performed, "H" for specifying the write operation is applied as the write/read input signal W/R from the external terminal P3.

Next, a process for instructing the semiconductor integrated circuit 1 for memory initialization and operation mode shifting will be described. As described above, when "L" is applied to the external terminal P1, the address counter 2 is initialized. This is a procedure absolutely required for initialization of the semiconductor integrated circuit 1 and some other circuits excluding the memory cell array 5, such as the write/read control circuit 6. Here, the external terminal P6 is open (hi-impedance condition).

In addition, when "L" is applied to the external terminal P1, the stand-by signal STB for the operation mode shifting is turned to "L", and the operation mode of the semiconductor integrated circuit 1 is shifted to the stand-by mode. When the operation mode of the semiconductor integrated circuit 1 is shifted to the stand-by mode, a part where current steadily flows is terminated, which attempting the reduction of the current consumption. More specifically, a sense amplifier provided within the input/output control circuit 8, for example, always needs current flow. Therefore, in order to suppress power consumption in the present circuit, when it is at the stand-by mode, the source voltage to be supplied to the input/output control circuit 8 is turned to OFF.

Thus, in this embodiment, when the chip-select input signal CS is "L", that is, when the external terminal P1 is in an unselected condition, the address counter 2 is initialized and the semiconductor integrated circuit 1 is shifted to the stand-by mode. Since these instructions are controlled by the inputs from the external terminal P1, that is a dual-usage terminal, the memory initialization function and the function for shifting to the stand-by mode are provided, attempting the reduction of the external terminals. Further, the control terminal for the memory initialization and the control terminal for operation mode control are coupled to one dual-usage terminal, which makes the control easier.

In this case, the functions for the circuit block initialization and the operation mode shifting may be arranged such that the address counter 2 is initialized and the semiconductor integrated circuit 1 is shifted to the stand-by mode when the logical output between the input from the external terminal P1 and the input from the other terminals are the unselect condition.

Figure 5:
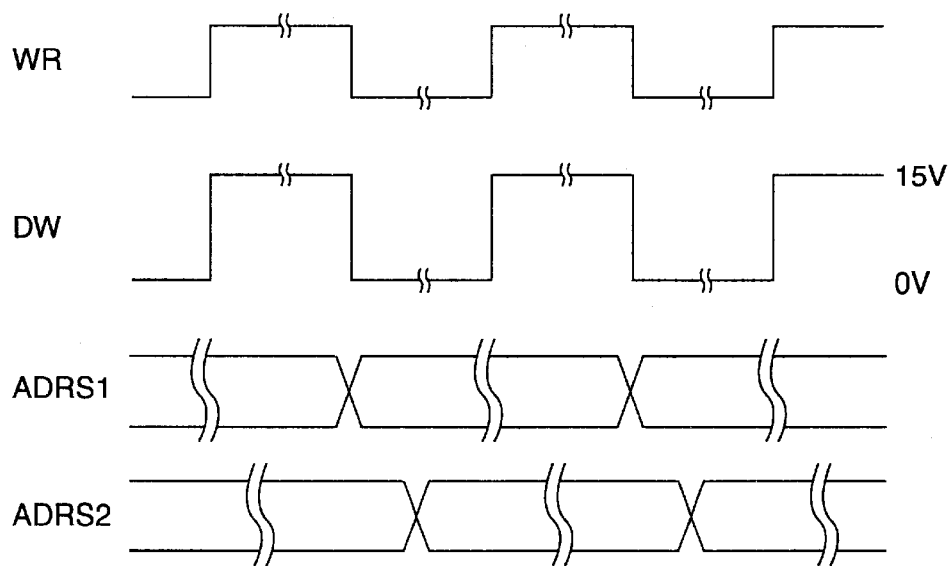
FIG. 5 is a timing chart showing an operation of each of the parts in FIG. 1.

FIG. 5 is a timing chart showing timing for address changes for write signals in the conventional circuit and the present circuit, respectively. Referring to the figure, voltage of the data line DW is changed in synchronous with timing of leading and trailing edges of the write signals WR. In this example, 0 volt and 15 volt are repeated alternately. In the conventional circuit, since the delay circuit 10 is not provided, a content at an address ADRS1 is changed synchronously with the trailing edge of the voltage waveform of the data line DW. Thus, the address is changed before discharge of stored charge in the parasitic capacitance is completed, wrong writing may be performed.

On the other hand, since the delay circuit 10 is provided in the present circuit, a content of an address ADRS2 is changed with a small delay when compared to the case of the address ADRS1. Here, if the delay time is defined as a time enough for completing the discharge of charge stored in the parasitic capacitance, the address is changed after the completion of the discharge. Therefore, in the present circuit, wrong writing is avoided. In other words, by suppressing a change in address for a predetermined period of time, the wrong writing can be prevented.

Figure 6:
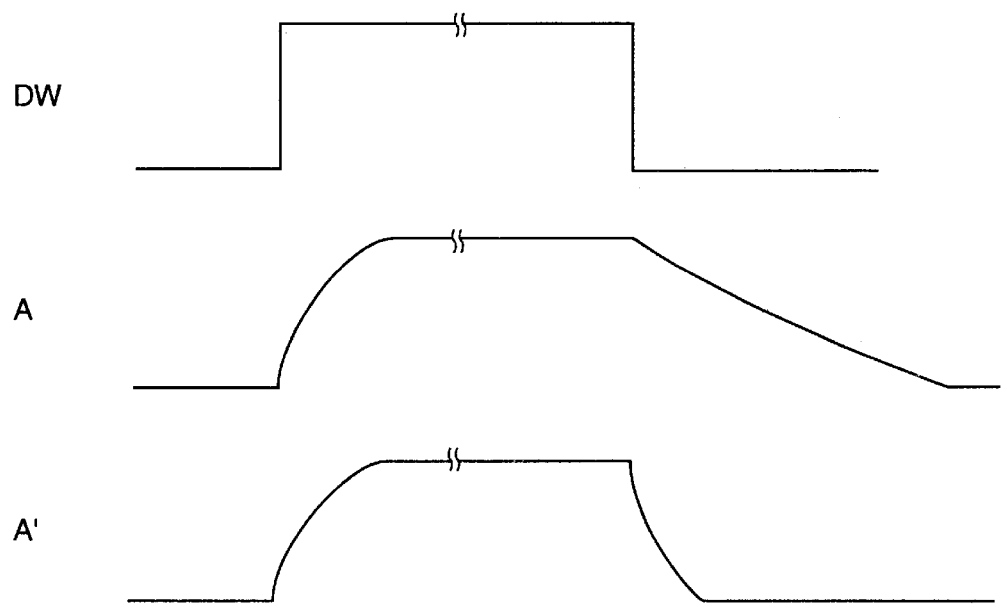
FIG. 6 is a waveform diagram showing a state of charging/discharging of a parasitic capacitance.

In FIG. 6, a charging/discharging waveform in the conventional circuit and a charging/discharging waveform in the present circuit are shown. With respect to the change in the data line DW, charge stored in the parasitic capacitance is discharged slowly in a node A of the conventional circuit, as shown in the figure. Therefore, the address is changed before the completion of the discharge, and wrong writing may occur.

On the other hand, in the present circuit, with respect to the change in the data line DW, charge stored in the parasitic capacitance are discharged quickly in a node A'. Therefore, the address is changed after the completion of the discharge, and the wrong writing does not occur.

As described above, since a delay circuit is provided in the present circuit, the address change is suppressed for a predetermined period of time. Thus, since a time for discharging charge stored in the parasitic capacitance can be reserved, and since the address is changed after the discharge is completed, wrong writing does not occur.

Figure 7:
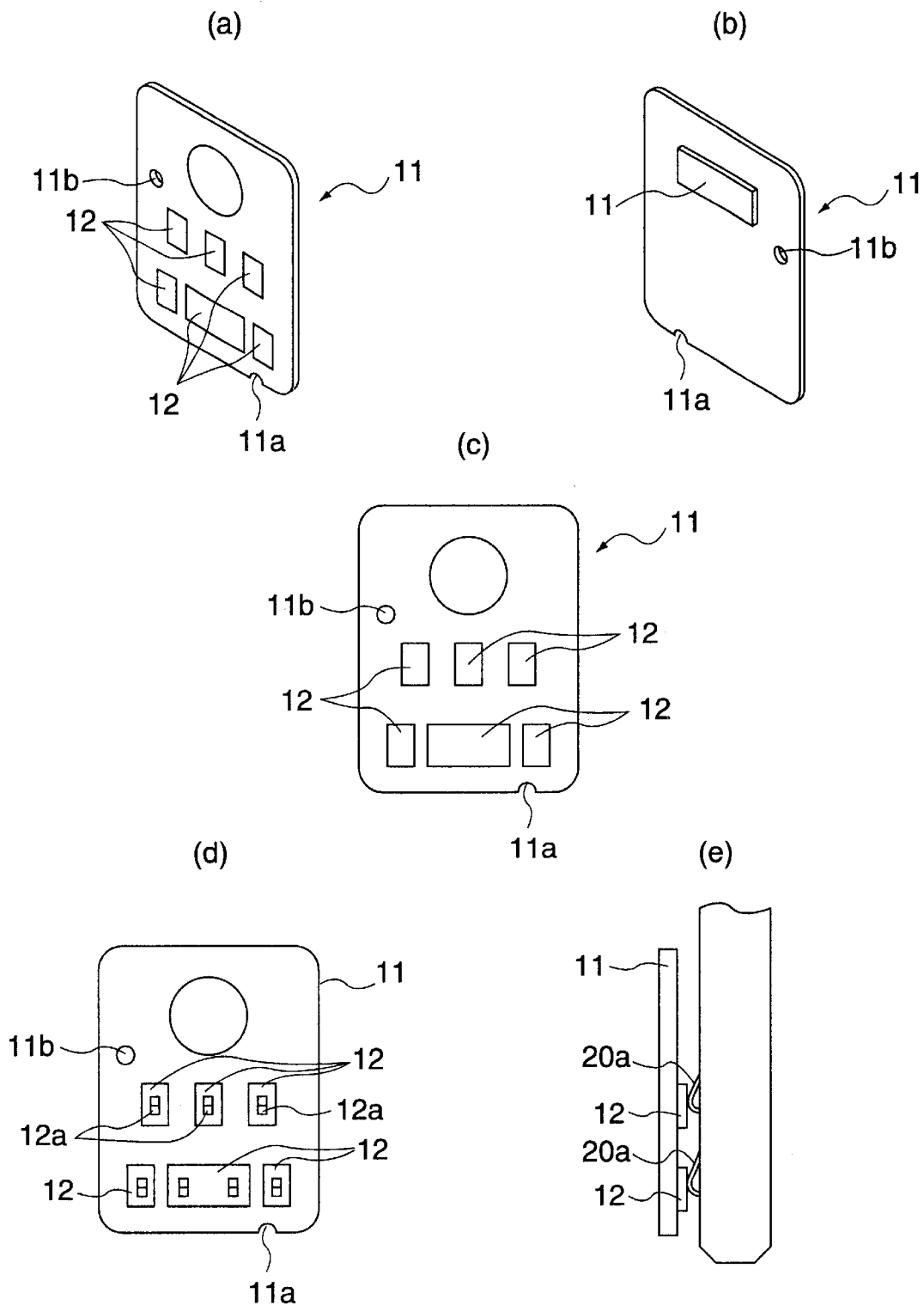
FIG. 7 is a diagram showing a circuit substrate on which the semiconductor integrated circuit shown in FIG. 1 is implemented.

FIGS. 7(a) to 7(e) are diagrams for showing a circuit substrate on which a semiconductor integrated circuit according to this embodiment is implemented. As shown in FIG. 7(a), contacts 12 are formed on a surface side of a circuit substrate 11. These contacts 12 are connected to the above-described external terminals P1 to P6. Further, as shown in FIG. 7(b), the semiconductor integrated circuit 1 is implemented on the back side of the circuit substrate 11.

As shown in FIG. 7(c), the circuit substrate 11 is in a substantially rectangular, plate form. The circuit substrate 11 is provided with a notch portion 11a and a hole portion 11b. They are used for positioning the circuit substrate 11 when implemented on an ink-cartridge described below. Further, as shown in FIG. 7(d), a recess 12a may be provided on the surface of each of the contacts 12 provided on the circuit substrate 11. Providing the recess 12a, as shown in FIG. 7(e) improves the electric connection condition with a contact 29 provided on the ink cartridge described below.

FIGS. 8(a) and (b) are diagrams for showing a condition where the circuit substrate shown in FIG. 4 is implemented on an ink cartridge. FIG. 8(a) shows a condition where the circuit substrate 11 is implemented on a black ink cartridge 20 accommodating black ink. The black ink cartridge 20 accommodates, in a container 21 formed as a substantial rectangular parallelepiped, a porous body, not shown, impregnated with black ink, and the top surface is sealed by a lid body 23. On the bottom surface of the container 21, an ink supplying outlet 24 is formed at a position facing to an ink supplying needle when attached to a holder. In addition, an overhang portion 26 associated with a projection of a lever of the body is formed integrally at an upper edge of a vertical wall 25 at the side of the ink supplying outlet. The overhang portions 26 are formed on the both side of the wall 25 separately, and each has a rib 26a. Further, a rectangular rib 27 is formed between a bottom surface and the wall 25.

The circuit substrate 11 is attached at the side where the ink supplying outlet of the horizontal wall 25 is formed. The circuit substrate 11 has a plurality of contacts on a surface facing to the contacts of the body and has a memory element implemented on the back surface. In addition, projections 25a and 25b and overhang portions 25c and 25d are formed on the horizontal wall 25 in order to position the circuit substrate 11.

On the other hand, FIG. 8(b) shows a condition where the implemented circuit substrate 11 is implemented on a color ink cartridge accommodating color ink. The color ink cartridge 30 accommodates, in a container 31 formed as a substantially a rectangular parallelepiped, a porous body, not shown, impregnated with ink and sealed with a lid body 33 on the upper surface.

Five ink accommodating portions accommodating five colors of color ink separately and respectively are sectionally formed inside of the container 51. At the bottom surface of the container 31, an ink supplying outlet 34 is formed depending on each ink color at a position facing to an ink supplying needle when attached to the holder. In addition, an overhang portion 36 associated with a projection of a lever of the body is formed integrally at an upper edge of a vertical wall 35 at the side of the ink supplying outlet. The overhang portions 36 are formed on the both side of the wall 35 separately, and each has a rib 36a. Further, a rectangular rib 37 is formed between a bottom surface and the wall 35. Furthermore, the container 31 has a recess 39 in order to prevent the mis-insertion.

A recess 38 is formed at a side of the horizontal wall 35 where an ink supplying outlet is formed such that it is positioned at the center of each cartridge 30 in the width direction, and the circuit substrate 11 is attached here. The circuit substrate 11 has a plurality of contacts on a surface facing to the contacts of the body and has a memory element implemented on the back surface. In addition, projections 35a and 35b and overhang portions 35c and 35d are formed on the horizontal wall 35 in order to position the circuit substrate 11.

Figure 8:
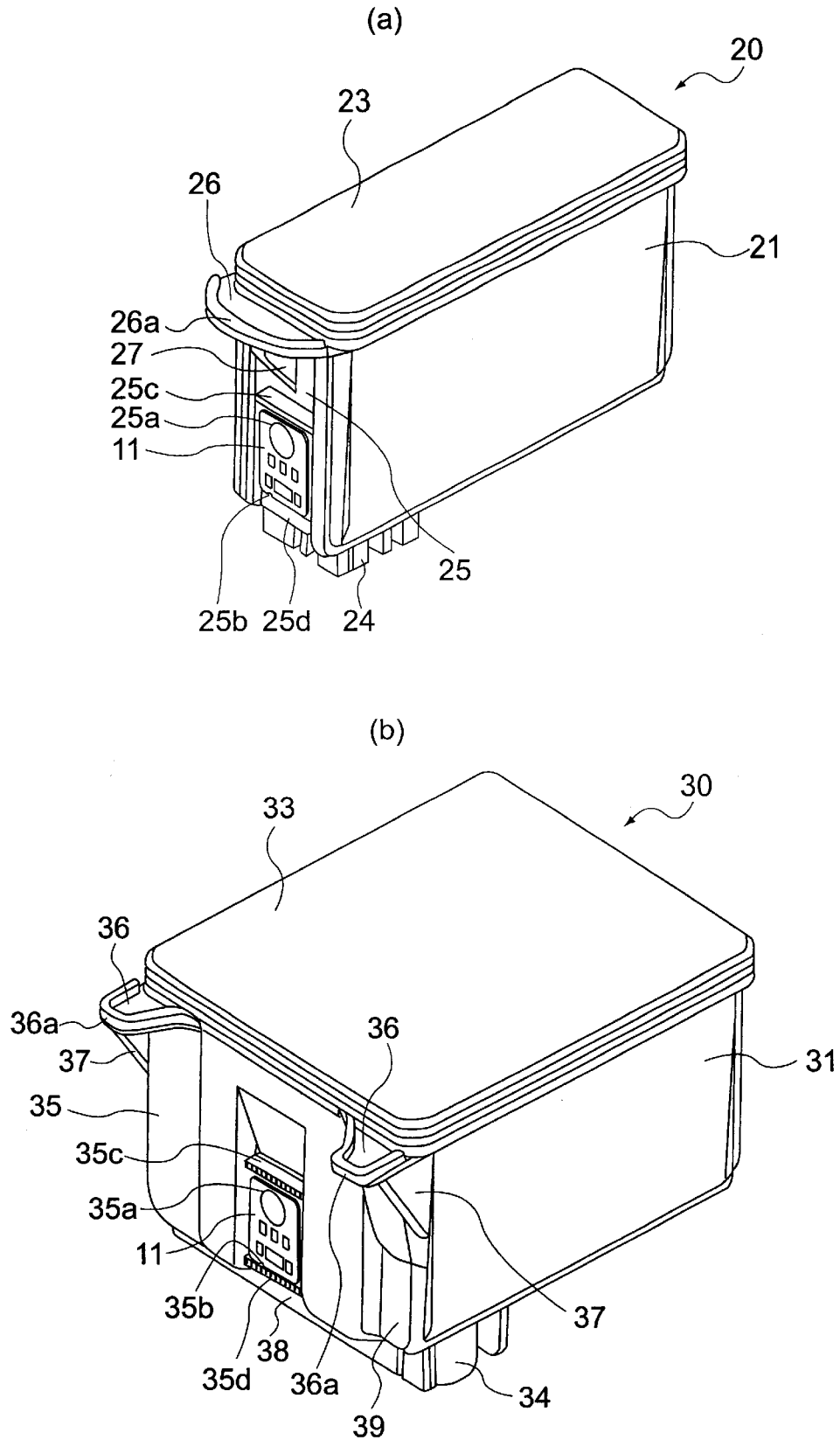
FIG. 8 is a diagram showing a condition where the circuit substrate shown in FIG. 7 is implemented on an ink cartridge.
Figure 9:
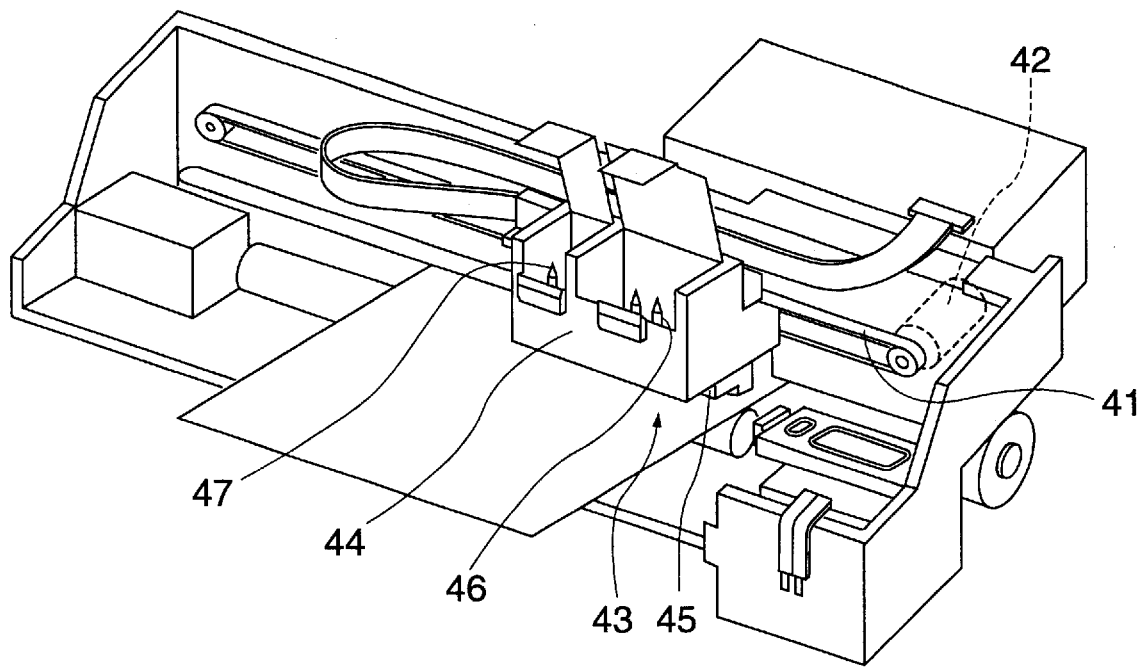
FIG. 9 is a diagram for showing an overview of an inkjet printer to which the ink cartridge shown in FIG. 8 is attached.

FIG. 9 is a diagram showing an overview of an inkjet printer (inkjet recording device) to which an ink cartridge shown in FIG. 8 is attached. In FIG. 9, a holder 44 for storing each of the black ink cartridge 30 shown in FIG. 8(a) and the color ink cartridge 30 shown in FIG. 8(b) is formed in a carriage 43 connected to a driving motor 42 through a timing belt 41. Further, a recording head 45 for receiving the supply of ink from each of the ink cartridges 20 and 30 at a bottom surface position on the carriage 43.

Ink supply needles 46 and 47 communicating with a recording head 45 is provided vertically on the bottom surface of the carriage 43 such that they are positioned at the inner part of the device, that is on the side of the timing belt 41.

Figure 10:
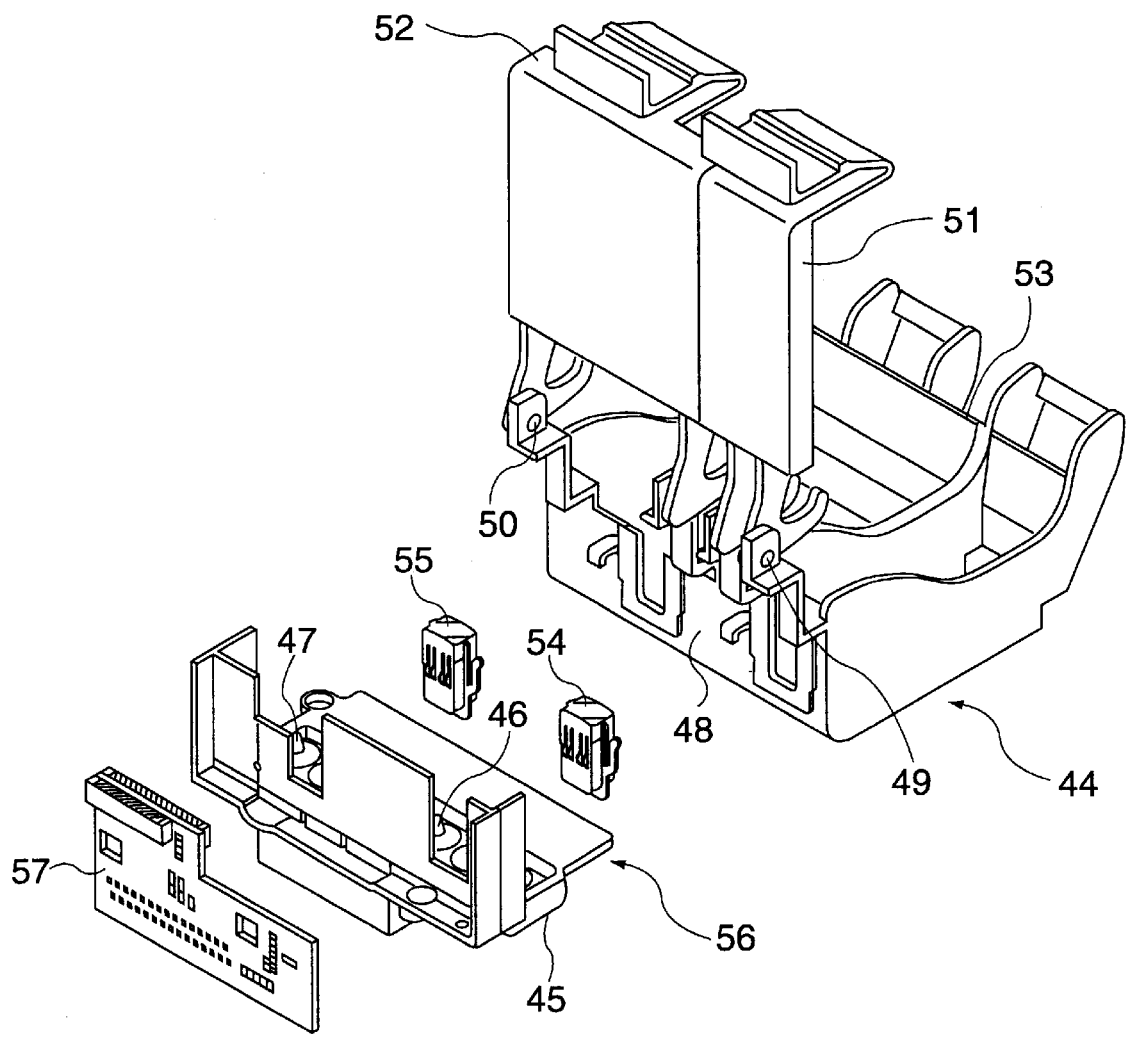
FIG. 10 is a diagram showing a construction of a carriage shown in FIG. 9.

FIG. 10 is a diagram showing a construction of the carriage shown in FIG. 9. As shown in FIG. 10, levers 51 and 52 are mounted rotatably with respect to axes 49 and 50 as fulcrums at the upper edge of a vertical wall 49 closely facing to the ink supply needles 46 and 47 among vertical walls forming the holder 44.

The wall 53 positioned on the side of free edges of the levers 51 and 52 have a slope portion where the bottom surface side is cut diagonally. Further, contact mechanisms 54 and 55 are provided on the vertical wall 48. The contact mechanisms 54 and 55 connected to the above-described contacts provided on the circuit substrate 11 in a condition where the ink-cartridge is attached. Thus, ink cartridge recording can be performed by using ink within the ink cartridge.

Additionally, a base platform 56 is mounted on the vertical wall 48 of the holder 44. Then, a circuit substrate 57 is mounted on the back surface of the base platform 56. The circuit substrate 57 is electrically connected with the contact mechanisms 54 and 55, resulting in that the circuit substrate 11 and the circuit substrate 57 provided in the ink cartridge are electrically connected.

Figure 11:
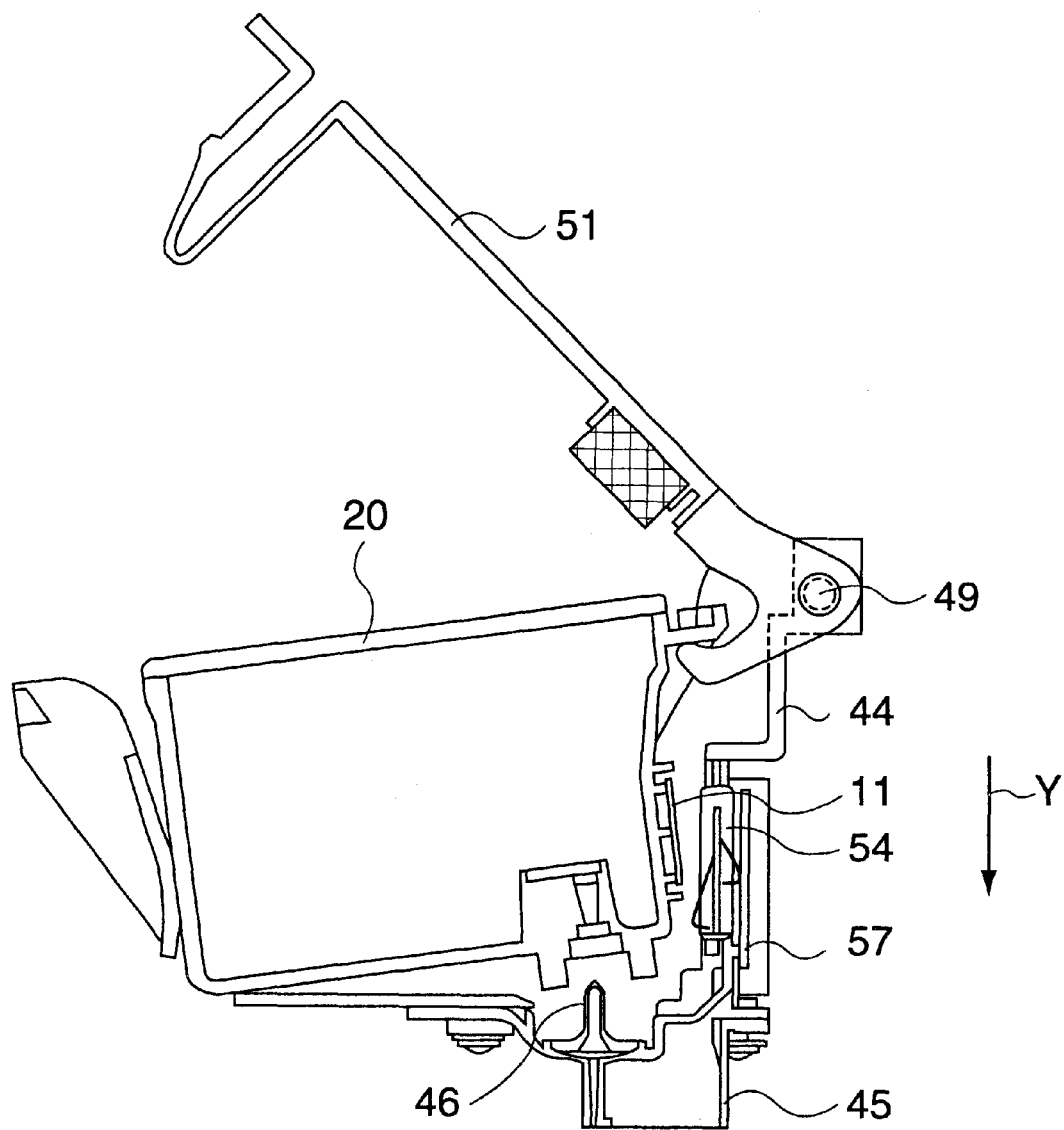
FIG. 11 is a diagram for showing a condition before an ink cartridge is attached to a holder.
Figure 12:
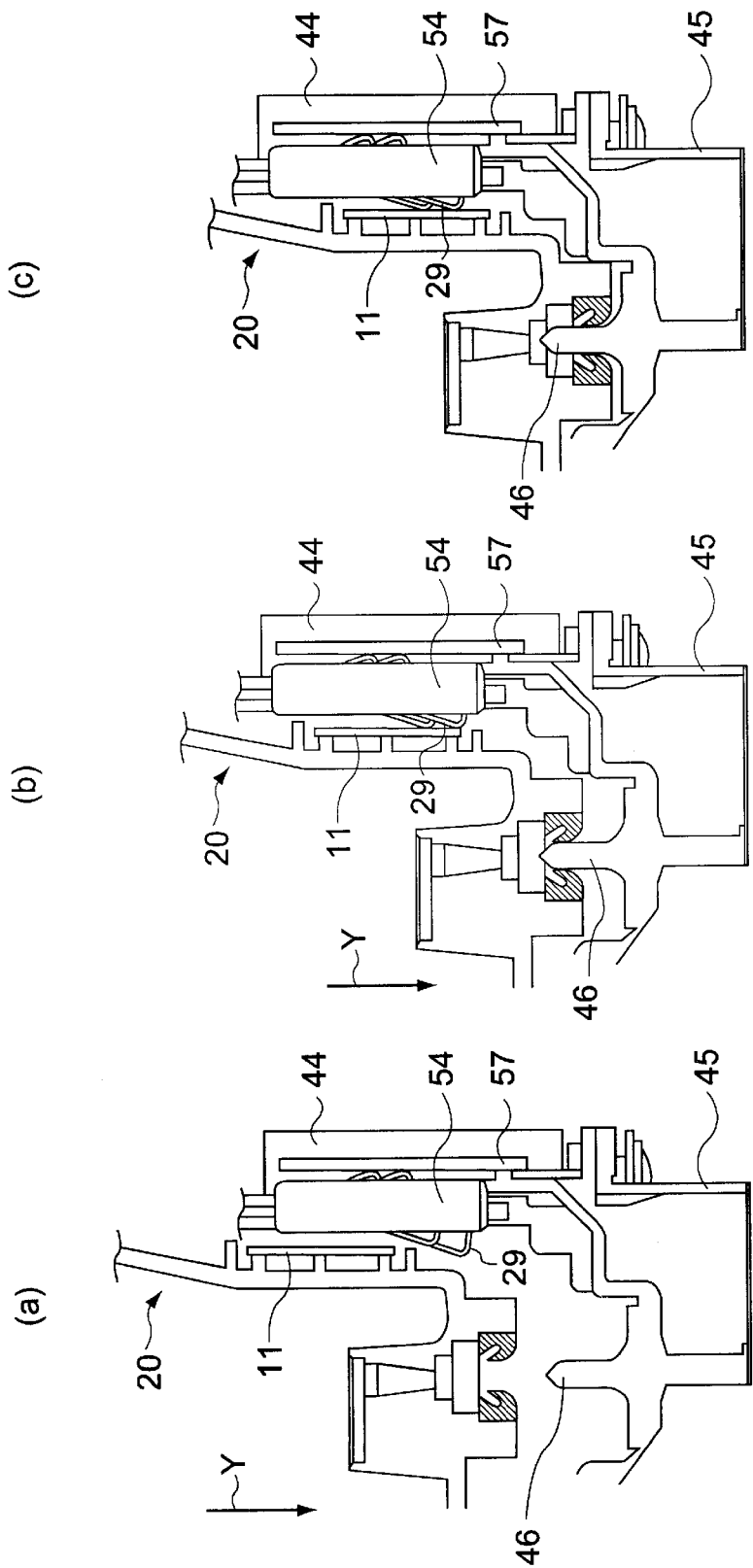
FIG. 12 is a diagram for showing a condition where an ink cartridge is attached to a holder.

FIG. 11 is a diagram showing a condition before the ink cartridge is attached to the holder, while FIGS. 12(a) to (c) are diagrams showing conditions where the ink cartridge is attached to the holder. As shown in FIG. 11, when the lever 51 is closed in a condition where the ink cartridge 20 is inserted to the holder 44, the ink cartridge 20 is pressed gradually in a direction of an arrow Y. Here, a condition shown in FIG. 12(a) is transited to a condition shown in FIG. 12(c), and the ink supply needle 46 is inserted inside of the ink cartridge 20. Ink is supplied from the ink cartridge 20 in a condition where the ink supply needle 46 is inserted inside of the ink cartridge 20 and the ink cartridge 20 is attached to the holder 44 completely, that is, in a condition shown in FIG. 12(c).

In the condition shown in FIG. 12(c), the contacts 12 provided on the circuit substrate 11 and the contacts 29 on the circuit substrate 57 provided on the side of the holder 44 are electrically connected. Thus, an inkjet printer can read and write data freely to/from the semiconductor integrated circuit 1. More specifically, when the power supply of the printer is ON, "L" is applied to the external terminal P1, while "H" is applied when a read or write operation needs to be performed. It can simplify the logic and contribute to the reduction of the chip size.

INDUSTRIAL APPLICABILITY

Thus, in this embodiment, there is an effect that, by defining a delay of timing as a time equal to or more than a time required for charge discharging, wrong writing due to residual charge can be prevented.

In general, several bits including 8 bits and 16 bits are regarded as one word, and this is often handled as a unit for reading and writing. However, in this case, a buffer is needed for storing one word temporally. Thus, the size of a circuit is increased, which is not suitable for being installed. in an ink cartridge. Therefore, in the present circuit, reading and/or writing are performed for every 1 bit after dividing one word into every 1 bit. Thus, in the present circuit, a buffer is no longer required for maintaining one word, which can reduce the size of a circuit and allows the installation in the ink cartridge.

Furthermore, by storing the remained amount of ink in an ink cartridge, at least, the remained amount of ink cartridge can be always monitored.

What is claimed is:

1. A semiconductor integrated circuit comprising:
   a plurality of memory cells arranged in an array of n rows and m columns;
   a plurality of column signal lines having a one-to-one correspondence with each of said m columns;
   a program addressing circuit for sequentially charging each of said column signal lines in response to a writing instruction for writing to all memory cells of said array, said program addressing circuit being effective for charging the next column signal line corresponding to the next column of memory cells after writing to all memory cells in a current column is complete, said semiconductor integrated circuit being effective for sequentially writing to each memory cell in the column corresponding to the current column signal line charged by said program addressing circuit; and
   a delay circuit for delaying an address transition of said program addressing circuit for at least a time equivalent to a discharge time for said column signal lines.

2. A semiconductor integrated circuit according to claim 1, wherein said delay circuit is further effective for defining a first time period for completing a writing operation to one memory cell and a second time period for changing the address indicating the next memory cell to be written following the completion of said writing operation to one memory cell, said second time period being used for said delaying of said address transition of said program addressing circuit.

3. A semiconductor integrated circuit according to claim 1, wherein said program addressing circuit includes:
   a counter for starting a count operation in response to said input of said writing instruction;
   a column decoder for decoding a count value from said counters;
   a switching element for charging said column signal lines by connecting a predetermined power supply to said column signal lines in response to a decoded result from said column decoder; and
   a row decoder for sequentially selecting each row of memory cells corresponding to the column signal line being charged by said switching element.

4. An ink cartridge having the semiconductor integrated circuit according to claim 1, said semiconductor integrated circuit being connected so as to be effective for storing in said memory array at least the amount of remaining ink in said ink cartridge.

5. An inkjet recording device having an ink cartridge according to claim 4 for printing desired image information by using ink supplied from the ink cartridge.

6. A semiconductor integrated circuit comprising:
   a memory array including a plurality of memory cells arranged in n rows and m columns;
   a write node for receiving a write signal, said semiconductor integrated circuit actuating a write operation on said memory array in response to said write signal being at a first logic level and ceasing said write operation in response to said write signal being at a second logic level;
   a program voltage transfer circuit having a program voltage output node and effective for selectively applying a programming voltage to said program voltage output node during the application of said write operation, said programming voltage being sufficient for altering the data content stored in said memory cells;
   an address decoder having an address input and effective for selecting a target memory cell within said memory array in accordance with said address input, said address decoder being further effective for routing said program voltage output node to said target memory cell;
   an address selection circuit for supplying a new target address to said address input in response to a logic transition of said write signal; and
   a transition suppressing circuit for suppressing the application of said new target address to said address input for a predetermined time period following said logic transition of said write signal.

7. The semiconductor integrated circuit of claim 6, wherein said transition suppressing circuit is a delay circuit responsive to said write node.

8. The semiconductor integrated circuit of claim 7, wherein said address selection circuit is an address counter.

9. The semiconductor integrated circuit of claim 8, wherein said address counter increments its address count in response to said logic transition of said write signal.

10. The semiconductor integrated circuit of claim 9, wherein said logic transition of said write signal is a transition from said first logic level to said second logic level.

11. The semiconductor integrated circuit of claim 9, wherein said write node is coupled to said address counter through said delay circuit.

12. The semiconductor integrated circuit of claim 6, further having a data input node for receiving an input data signal;

said program voltage transfer circuit applying said programing voltage to said program voltage output node in accordance with said input data signal during said write operation.

13. The semiconductor integrated circuit of claim 12, wherein said program voltage transfer circuit maintains a substantially ground potential at said program voltage output node when no write operation is being applied to said memory array.

14. The semiconductor integrated circuit of claim 6, wherein said address decoder includes a plurality of transfer circuits for selectively coupling said program voltage output node to a targeted one of said column lines or row lines.

15. The semiconductor integrated circuit of claim 14, further having a write/read input node effective for indicating one of a write mode of operation and a read mode of operation for said memory cell array, said semiconductor integrated circuit responding to said write signal only when said write/read input node indicates said write mode of operation;

said address decoder maintaining said program voltage output node coupled to said targeted one of said column lines or row lines as long as said write/read input node indicates said write mode of operation irrespective of the logic level of said write signal.

16. The semiconductor integrated circuit of claim 6, wherein said address decoder includes a plurality of transfer circuits for selectively coupling said program voltage output node to a targeted one of said column lines, and wherein;

said address selection circuit is further effective for targeting said memory cells in a specific sequence pattern, said sequence pattern consisting of sequentially addressing all memory cells within a first targeted column of memory cells and upon reaching the last memory cell on said first targeted column, selecting an adjacent column of memory cells as a second targeted column and then sequentially addressing all memory cells within said second targeted column, said specific pattern being repeated until all memory cells within said memory array are addressed.

17. The semiconductor integrated circuit of claim 6, further having a column line per column of memory cells for addressing all memory cells coupled to a respective column line, and a row line per row of memory cells for addressing all memory cells coupled to a respective row line, a target memory cell being addressed by selection of its corresponding column line and row line, and wherein;

said predetermined time period is substantially equal to the time required to discharge one of said column lines.

18. An ink cartridge having the semiconductor integrated circuit according to claim 6, said semiconductor integrated circuit being connected so as to be effective for storing in said memory cell array at least the amount of remaining ink in said ink cartridge.

19. An inkjet recording device having an ink cartridge according to claim 18 for printing desired image information by using ink supplied from said ink cartridge.

* * * * *

UNITED STATES PATENT AND TRADEMARK OFFICE
CERTIFICATE OF CORRECTION

PATENT NO. : 6,487,123 B1
DATED : November 26, 2002
INVENTOR(S) : Tetsuo Takagi

It is certified that error appears in the above-identified patent and that said Letters Patent is hereby corrected as shown below:

Column 12,
Line 15, change "counters" to -- counter --.

Column 13,
Line 11, change "programing" to -- programming --.

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,487,123 B1
DATED         : November 26, 2002
INVENTOR(S)   : Tetsuo Takagi It is certified that error appears in the above-identified patent and that said Letters Patent is hereby corrected as shown below:

<u>Title page,</u>
Item [73] should read as follows: -- [73] Assignee: Seiko Epson Corporation, Tokyo (JP) --.

Signed and Sealed this

Nineteenth Day of August, 2003

JAMES E. ROGAN
*Director of the United States Patent and Trademark Office*